United States Patent [19]

Ieki et al.

[11] Patent Number: 5,162,690
[45] Date of Patent: Nov. 10, 1992

[54] SURFACE ACOUSTIC WAVE DEVICE

[75] Inventors: Hideharu Ieki; Atsushi Sakurai; Koji Kimura, all of Kyoto, Japan

[73] Assignee: Murata Manufacturing Co., Ltd., Japan

[21] Appl. No.: 508,837

[22] Filed: Apr. 12, 1990

[30] Foreign Application Priority Data

| Apr. 14, 1989 | [JP] | Japan | 1-96166 |
| Jun. 13, 1989 | [JP] | Japan | 1-151044 |
| Jun. 13, 1989 | [JP] | Japan | 1-151045 |
| Jun. 13, 1989 | [JP] | Japan | 1-151046 |
| Jun. 20, 1989 | [JP] | Japan | 1-157222 |

[51] Int. Cl.$^5$ .......................................... H01L 41/08
[52] U.S. Cl. .................. 310/313 R; 310/363; 310/364; 310/313 B; 310/313 C; 310/313 D
[58] Field of Search ........... 310/313 R, 313 B, 313 C, 310/313 D, 363, 364

[56] References Cited

U.S. PATENT DOCUMENTS

| 4,122,407 | 10/1978 | Van Vechten | 372/44 |
| 4,189,516 | 2/1980 | Dryburgh et al. | 310/313 R |
| 4,249,190 | 2/1981 | Cho | 357/68 |
| 4,272,742 | 6/1981 | Lewis | 333/155 |
| 4,302,700 | 11/1981 | Bohg et al. | 313/392 |
| 4,512,198 | 4/1985 | Sinha et al. | 73/703 |
| 4,587,712 | 5/1986 | Baliga | 437/6 |
| 4,617,487 | 10/1986 | Sone et al. | 310/313 D |
| 4,634,913 | 1/1987 | Whatmore et al. | 310/313 D |
| 4,757,226 | 7/1988 | Mitsutsuka et al. | 310/313 R |
| 4,906,885 | 3/1990 | Kojima et al. | 310/313 R |
| 4,942,327 | 7/1990 | Watanabe et al. | 310/313 R |
| 5,061,870 | 10/1991 | Ieki et al. | 310/313 A |

FOREIGN PATENT DOCUMENTS 0246626  11/1987  European Pat. Off. .
0049014   4/1980  Japan .................. 310/363
63-114144 5/1988  Japan .
8203511   4/1981  World Int. Prop. O. ...... 310/313 D

OTHER PUBLICATIONS

R. Whatmore, et al., "Lithium Tetraborate: A New Temperature Compensated SAW Substrate Material", Nov. 19, 1980.

N. Shorrocks, et al., "Lithium Tetraborate-A New Temperature-Compensated Substrate Material for Surface Acoustic Wave Devices", Date unknown.

J. Collins, et al., "Surface Wave Delay Lines Promise Filters for Radars, Flat Tubes for Television and Faster Computers", Jan. 19, 1970.

H. Gerard, et al., "500 MHz Bandwidth RAC Filter with Constant Groove Depth", Sep. 25, 1978.

W. Tanski, "Elements of SAW Resonator Fabrication and Performance", May 1981.

K. Tsubouchi et al., "High-Frequency and Low-Dispersion SAW Devices on AlN/Al$_2$O$_3$ and AlN/S: For Signal Processing," Nov. 5, 1980.

M. Takeuchi et al., "New Types of SAW Reflectors and Resonators Consisting of Reflecting Elements with Positive and Negative Reflection Coefficients," Dec. 9, 1985.

European Search Report, Apr. 2, 1991.

*Primary Examiner*—Mark O. Budd
*Assistant Examiner*—Thomas M. Dougherty
*Attorney, Agent, or Firm*—Ostrolenk, Faber, Gerb & Soffen

[57] ABSTRACT

Interdigital transducers (3, 4) and reflectors (5, 6) are formed on a piezoelectric substrate (2) by an aluminum film. The aluminum film is crystallographically oriented in a constant direction, whereby stressmigration of the aluminum film is suppressed.

15 Claims, 6 Drawing Sheets

SURFACE ACOUSTIC WAVE DEVICE

BACKGROUND OF THE INVENTION

1. Field of the Invention

The present invention relates to a surface acoustic wave device, and more particularly, it relates to a surface acoustic wave device which comprises a piezoelectric substrate and electrodes of aluminum provided on the piezoelectric substrate.

2. Description of the Background Art

In recent years, widely employed is a surface acoustic wave device such as a filter, a resonator or the like using surface acoustic waves, which may be hereinafter referred to as SAW.

Such a surface acoustic wave device generally comprises a piezoelectric substrate, which is provided on its surface with interdigital transducers and/or grating reflectors formed by metal strips.

The piezoelectric substrate is prepared from a single crystal material such as quartz crystal, lithium tantalate ($LiTaO_3$), lithium niobate ($LiNbO_3$) or lithium tetraborate ($Li_2B_4O_7$), or a $ZnO/Al_2O_3$ material formed by a substrate of sapphire ($Al_2O_3$) and a film of zinc oxide (ZnO) provided thereon.

The aforementioned interdigital transducers and grating reflectors are generally prepared from aluminum, which is easy to photolithograph and has a small electrode loading mass effect due to its small specific gravity, and high conductivity.

However, it has been recognized that, when a signal of a high voltage level is applied to a surface acoustic wave device such as a SAW filter or resonator, the aluminum electrodes are exposed to strong stress by surface acoustic waves, to cause migration. Such migration caused by stress is called stressmigration, to be distinguished from electromigration. The stressmigration leads to an electric short, increase in insertion loss, reduction in quality factor (Q) of the resonator, and the like. Such stressmigration easily occurs as the frequency is increased, to cause a significant problem particularly in a surface acoustic wave device which is used in a high frequency range.

As to a resonator, in particular, it is necessary to increase the gain of an oscillation circuit for applying a signal of an excessive voltage level, in order to cause stable oscillation. In a resonator having reflectors which are provided on both sides of one or some transducers, surface waves are confined between the reflectors and standing waves are applied to the transducers and reflectors, to apply strong stress thereto. Thus, stressmigration is particularly easily caused in the resonator. To this end, a conventional SAW resonator has been unavoidably driven at a low voltage level, in order to suppress such stressmigration to the minimum. Thus, it has been impossible to increase the C/N ratio (carrier-to-noise ratio) or to suppress SSB (Single-Side-Band) phase noises.

As to a SAW filter, stressmigration particularly easily occurs in a transmission filter, which receives a signal of a high voltage level.

In order to prevent the aforementioned stressmigration, a small amount of Cu, Ti, Ni, Mg, Pd or the like is added to the electrode material of aluminum. However, no satisfactory effect has been attained by such a countermeasure.

A substrate of Y-cut (LST-cut) quartz crystal rotating at an angle of about 105° has been recently watched as a substrate for a surface acoustic wave device having excellent temperature characteristics. The surface acoustic wave device formed by such a substrate of LST-cut quartz crystal is superior in temperature characteristic to that formed by a substrate of ST-cut quartz crystal, such that leakage surface acoustic waves (LSAW) are propagated on the surface of the substrate.

However, it is known that, when such an LST-cut quartz crystal substrate is applied to a resonator, for example, its quality factor is abruptly reduced to deteriorate characteristics if the thickness of aluminum electrodes exceeds 1% of the wavelength of surface acoustic waves, although no particular problem is caused when an ST-cut quartz crystal substrate is employed even if the thickness of aluminum electrodes is about 2% of the wavelength of the surface acoustic waves. If the aluminum electrodes provided on the LST-cut crystal substrate are reduced in thickness in order to avoid such deterioration of the characteristics, apparent electrical resistivity is increased since general polycrystalline aluminum forming the electrodes has a large grain size. Thus, insertion loss is increased and the quality factor is reduced. Such disadvantages are remarkable particularly in a high-frequency range of short wavelengths.

SUMMARY OF THE INVENTION

The inventors have further investigated the cause for the aforementioned stressmigration. As the result, it has been recognized that an aluminum film formed through electron beam deposition, sputtering or the like for providing electrodes is not crystallographically oriented in constant directions but is in an amorphous polycrystalline state. Thus, stressmigration may be caused by mass transport via grain boundaries in such aluminum electrodes.

Accordingly, an object of the present invention is to provide a surface acoustic wave device comprising aluminum electrodes, which hardly cause stressmigration.

The present invention is directed to a surface acoustic wave device which comprises a piezoelectric substrate and electrode means provided on the piezoelectric substrate for forming a transducer, for example, and the feature of the present invention resides in that the electrode means includes a film of aluminum which is crystallographically oriented in constant directions.

It is considered that an aluminum film which is thus crystallographically oriented in constant directions exhibits properties which are similar to those of a single crystal film. Thus, such an aluminum film hardly causes stressmigration. According to the present invention, therefore, it is possible to prevent an electric short as well as increase in insertion loss caused by stressmigration. When the present invention is applied to a resonator, it is possible to prevent reduction of its quality factor caused by stressmigration. Thus, the life of the inventive surface acoustic wave device can be prolonged by suppressing stressmigration.

In general, stressmigration remarkably occurs with increase in frequency. According to the present invention, however, such stressmigration can be suppressed to maintain the surface acoustic wave device in good characteristics in high-frequency range.

According to the present invention, further, it is possible to suppress stressmigration even if a signal of a high voltage level is applied. Thus, the inventive surface acoustic wave device can be practically applied to a circuit having a high signal level. When the present invention is applied to a surface acoustic wave resonator, therefore, it is possible to apply a signal of a high voltage level with no problem, whereby the C/N ratio can be increased and SSB phase noises can be reduced. Further, it is possible to stably oscillate the resonator, which can be used in an overdriven state with an increased gain. The present invention can also be advantageously applied to a transmission filter, to which a high-voltage signal is applied.

Preferably the piezoelectric substrate is formed by a single crystal substrate such as a quartz crystal substrate, a $LiTaO_3$ substrate, a $LiNbO_3$ substrate or a $Li_2B_4O_7$ substrate, or a $ZnO/Al_2O_3$ substrate which is prepared by a ZnO thin film epitaxially grown on a sapphire substrate.

When the piezoelectric substrate is formed by a quartz crystal substrate, a substrate of rotating Y-cut crystal is preferably employed. When the piezoelectric substrate is thus formed by a quartz crystal substrate, an aluminum film is preferably prepared from a (311) oriented film.

In a preferred embodiment of the present invention, the angle of rotation of the rotating Y-cut crystal forming the substrate is selected within a range of 25° to 39°.

In another preferred embodiment of the present invention, the angle of rotation of the rotating Y-cut crystal employed for the substrate is selected within a range of 103° to 107°. Thus provided is such a surface acoustic wave device that leakage surface acoustic waves are propagated on its substrate. The aluminum film which is crystallographically oriented in a constant direction exhibits properties similar to those of a single crystal film. Thus, good electrical conduction can be retained even if the aluminum film is reduced in thickness since the same is not an aggregate of grains. Therefore, it is possible to effectuate good temperature characteristics originally provided in the surface acoustic wave device which is formed by an LST-cut quartz crystal substrate particularly in a high-frequency domain. Thus, it is possible to implement a surface acoustic wave device, which can be used in a high-frequency domain, with a substrate of LST-cut quartz crystal.

When the piezoelectric substrate is prepared from $Li_2b_4O_7$, it is preferable to use a substrate of X-cut crystal rotating at an angle of 45°.

A small amount of admixture such as Cu, Ti, Ni, Mg, Pd or the like may be added to the aluminum film, in order to further effectively suppress stressmigration. The content of such an admixture is preferably selected within a range of 0.1 to 10 percent by weight.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
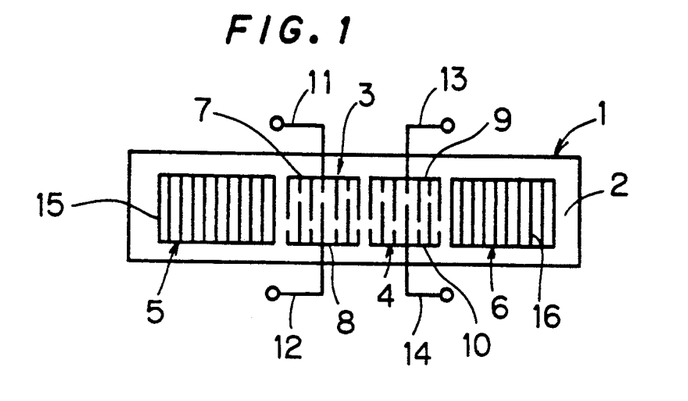
FIG. 1 is a plan view showing a surface acoustic wave device according to an embodiment of the present invention.

Referring to FIG. 1, a surface acoustic wave device 1 comprises a piezoelectric substrate 2. The piezoelectric substrate 2 is provided on its surface with, e.g., two interdigital transducers 3 and 4 and two grating reflectors 5 and 6 which are positioned to hold the transducers 3 and 4. The interdigital transducer 3 comprises a pair of interdigital electrodes 7 and 8. Electrode fingers provided in the interdigital electrode 7 are partially opposite to those provided in the interdigital electrode 8. On the other hand, the interdigital transducer 4 comprises a pair of interdigital electrodes 9 and 10. Electrode fingers provided in the interdigital electrode 9 are partially opposite to those provided in the interdigital electrode 10. Lead terminals 11, 12, 13 and 14 are connected to the interdigital electrodes 7, 8, 9 and 10 respectively.

The reflectors 5 and 6 are formed by grating electrodes, which are provided with numbers of parallel metal strips 15 and 16 respectively.

Such a surface acoustic wave device 1 is applicable to both of a two-port SAW resonator and a two-port SAW filter. In order to apply the device to a one-port SAW resonator, one of the transducers 3 and 4 may be omitted. The reflectors 5 and 6 may be formed by numbers of grooves which are provided on the piezoelectric substrate 2. When the surface acoustic wave device 1 is applied to a SAW filter, on the other hand, one of the transducers 3 and 4 serves as an input transducer, and the remaining one serves as an output transducer. In the case of the filter, the reflectors 5 and 6 may be omitted. Further, the filter may be provided with three or more transducers.

Example of the surface acoustic wave device 1 shown in FIG. 1 is now described in detail along the sequence of manufacturing the same.

A piezoelectric substrate 2 was formed by a specularly polished substrate of rotating Y-cut quartz crystal having an angle of rotation of 33.5°. An aluminum film of about 1000Å in thickness was formed on the surface of this piezoelectric substrate 2 through electron beam deposition.

In formation of such an aluminum film, the rate of deposition and the temperature of the substrate 2 have been generally selected at 10 Å/sec. and +160° C. respectively. However, such possibility has been found that the aluminum film is crystallographically oriented in a constant direction by increasing the rate of deposition and reducing the temperature of the substrate 2. As the result of an experiment made by the inventors, a (311) oriented aluminum film was obtained when the rate of deposition was set at 40 Å/sec. and the temperature of the substrate 2 was set at 80° C.

Figure 5A:
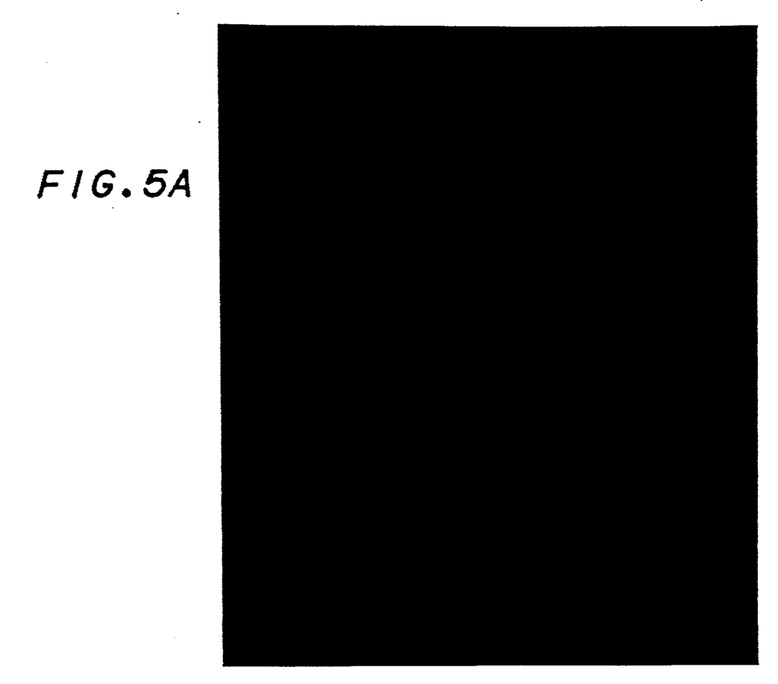
FIG. 5A shows a photograph of an aluminum film according to Example of the present invention taken through reflection high-energy electron diffraction (RHEED)

It was confirmed by reflection high-energy electron diffraction (RHEED) that the (311) plane of this aluminum film was epitaxially grown. FIG. 5A shows a photograph of the aluminum film taken through such RHEED, and FIG. 5B is an explanatory diagram for FIG. 5A.

Figure 5B:
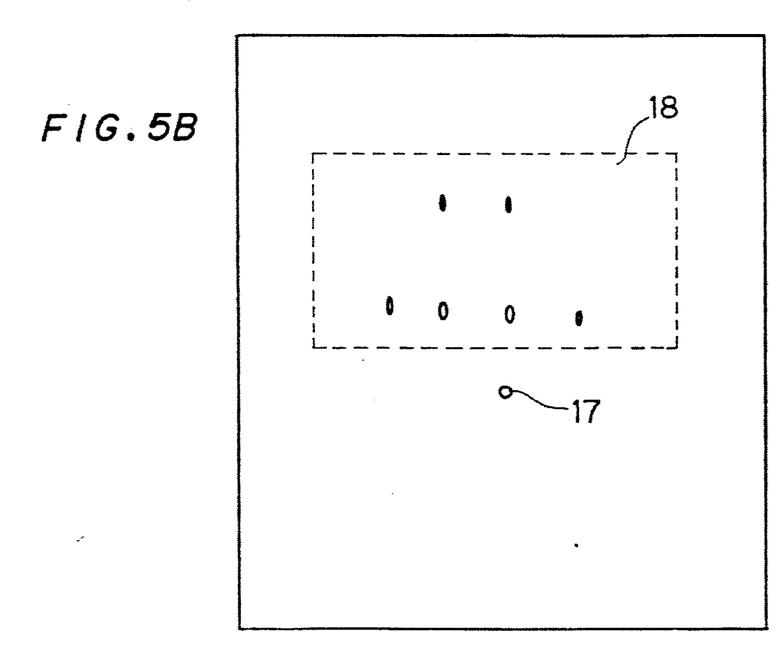
FIG. 5B is an explanatory diagram for FIG. 5A.

Referring to FIG. 5B, numeral 17 denotes a direct spot of an electron beam, and a reflected pattern is observed in a region 18. As shown in FIGS. 5A and 5B, spots appear in the reflected pattern due to periodicity of the crystal structure of the aluminum film. Thus, it can be confirmed that the aluminum film obtained in the aforementioned manner was epitaxially grown.

Figure 6A:
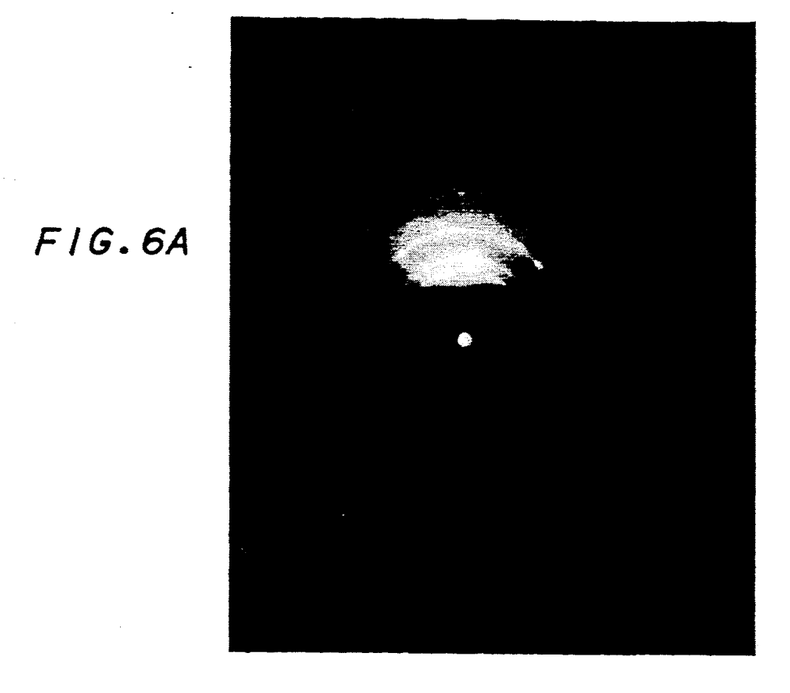
FIG. 6A is a photograph of an aluminum film according to reference example taken through RHEED.

On the other hand, it has also been confirmed that an aluminum film deposited under the aforementioned conditions of the rate of deposition of 10 Å/sec. and the substrate temperature of +160° C. was not epitaxially grown but was in a random-oriented (amorphous) state. FIG. 6A shows a photograph of such reference example taken through RHEED, and FIG. 6B is an explanatory diagram for FIG. 6A.

Figure 6B:
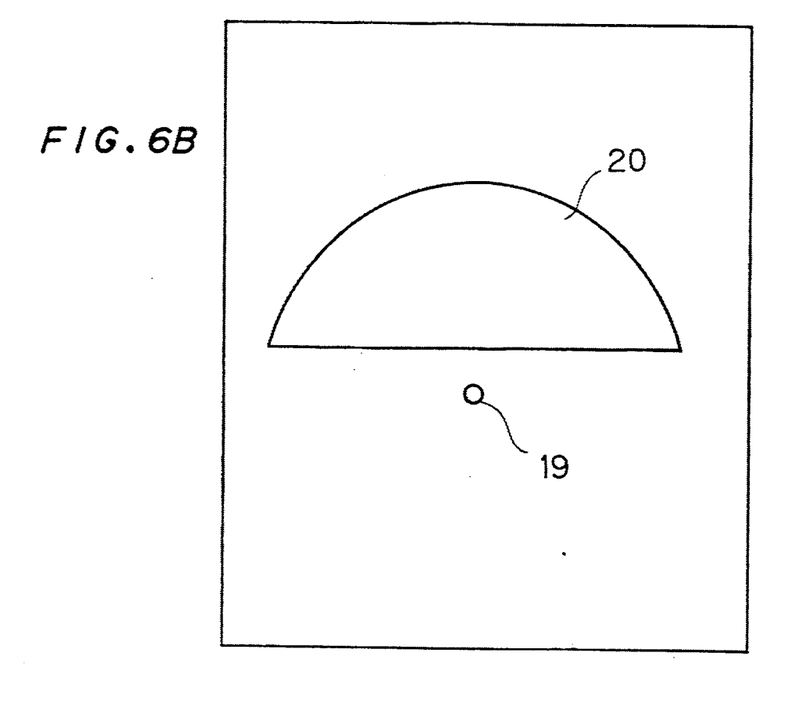
FIG. 6B is an explanatory diagram for FIG. 6A.

Referring to FIG. 6B, numeral 19 denotes a direct spot of an electron beam, and a reflected pattern is observed in a region 20. No spot appears in the reflected pattern, which is in the form of a ring or a halo. When such a ring-shaped or halo-shaped reflected pattern is obtained, the aluminum film may be evaluated as being polycrystalline or amorphous.

Each of the aforementioned Example of the present invention and reference example was worked in the following manner:

An aluminum film was worked through photolithography, to form two interdigital transducers 3 and 4 as well as reflectors 5 and 6 formed by grating electrodes on the surface of a piezoelectric substrate 2, as shown in FIG. 1.

In a surface acoustic wave device 1 thus obtained, the wavelength of surface acoustic waves was about 4.7 $\mu$m and the width of each electrode finger was about 1.17 $\mu$m, while the aperture was about 100 wavelengths. Each of interdigital electrodes 7, 8, 9 and 10 included in the transducers 3 and 4 had 50 electrode fingers, while each of the reflectors 5 and 6 had 300 metal strips.

Figure 2:
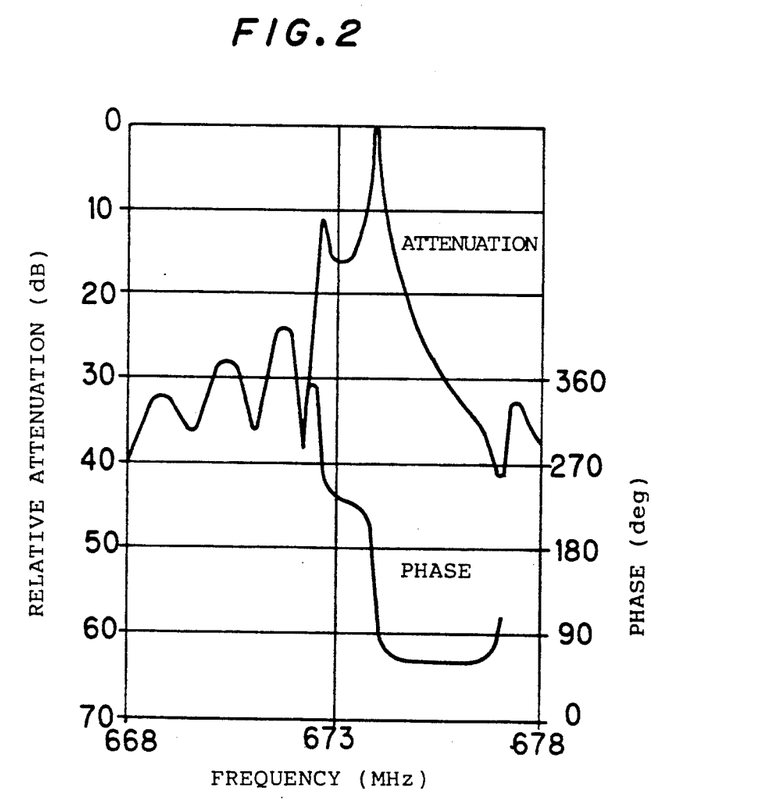
FIG. 2 illustrates transmission response of the surface acoustic wave device shown in FIG. 1 in 50 Ω system.

FIG. 2 shows transmission response of a two-port SAW resonator in 50 $\Omega$ system according to Example obtained in the aforementioned manner. As understood from FIG. 2, the peak of attenuation appears at a frequency of about 674 MHz. Insertion loss at this peak frequency was about 6 dB. Referring to FIG. 2, the left vertical line represents relative attenuation, with insertion loss of 0 dB at the peak frequency. The characteristics of a SAW resonator prepared according to reference example were substantially similar to those shown in FIG. 2.

Figure 3:
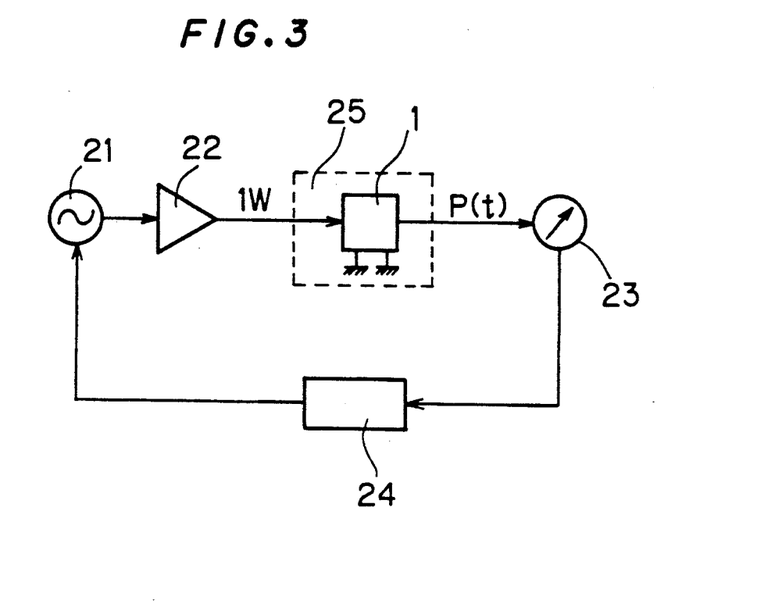
FIG. 3 is a circuit diagram of a system employed for evaluating power resistance of surface acoustic wave devices.

FIG. 3 shows a system which was employed for evaluating power resistance, i.e., stressmigration suppressibility of each of Example and reference example. The system shown in FIG. 3 is adapted to power-amplify an output of an oscillator 21 with a power amplifier 22, whose output is applied to a SAW resonator 1. An output P(t) of the SAW resonator 1 is inputted in a power meter 23, which measures the output level thereof. The output of the power meter 23 is fed back to the oscillator 21 through a computer 24, whereby the frequency of the oscillator 21 is controlled so that a signal applied to the SAW resonator 1 is regularly at the peak frequency of transmission response. The SAW resonator 1 is contained in a thermostatic oven 25, so that the SAW resonator 1 is under a high ambient temperature of 85° C., in order to provide a condition for increasing the speed for deteriorating the SAW resonator 1.

Figure 4:
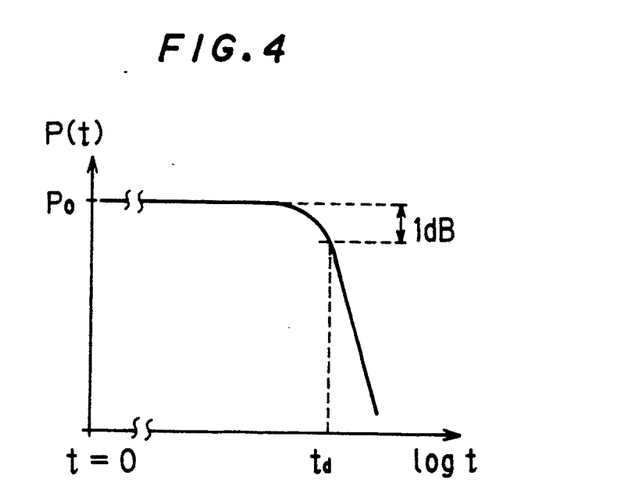
FIG. 4 illustrates a curve employed for deciding the end of life caused by stressmigration.

The output of the power amplifier 22 was set at 1W (50 $\Omega$ system) and an initial output level $P_0$ was measured to determine that the SAW resonator 1 reached the end of life td when $P(t) \leq P_0 - 1$ (dB), where P(t) represents an output attained after a lapse of a certain time t. FIG. 4 illustrates a general curve of the output P(t). Thus, it may be proper to estimate that the resonator reaches the end of life td when the initial output $P_0$ is reduced by 1 dB.

Samples A, B and C were prepared by forming interdigital transducers 3 and 4 and reflectors 5 and 6 with aluminum films made of the following materials:

A: random-oriented pure aluminum

B: random-oriented aluminum containing 1 wt.% of Cu

C: pure aluminum epitaxially grown

The samples A and B corresponded to reference example. The sample B was prepared by adding Cu, having a migration suppressing effect, to aluminum. The sample C corresponded to Example of the present invention.

The samples A, B and C were formed by piezoelectric substrates of quartz crystal having the same cut angles, and transducers and reflectors having the same patterns.

The lifetimes of these samples were evaluated through the system shown in FIG. 3, to attain the following results:

A: not more than 5 minutes

B: about 150 minutes

C: at least 900 minutes

The life of the sample B was longer by about 30 times than the sample A due to the effect of addition of Cu, while the life of the sample C was further longer by about 6 times than the sample B due to the effect of epitaxial growth of the aluminum film. In other words, the life of the sample C, which was prepared from pure aluminum, was longer by at least 180 times than that of the sample A, which was also prepared from pure aluminum.

Then, addition of Cu, the migration suppressing effect of which was confirmed through the sample B, was applied to the sample C. A sample similar to the sample C was prepared by forming an aluminum epitaxial film containing 1 percent by weight of Cu. Power application of 1W was proved to be improper since the life of this sample was too long. Hence, power of 2.5W was applied, to confirm that the sample attained life of at least 8000 minutes. It is generally said that an acceleration factor by power is the third or fourth power, and hence the acceleration factor in relation to power application of 2.5W is $2.5^3$ or $2.5^4$, i.e., about 15 to about 39 times as compared with the case of power application of 1W. Thus, the life of at least 8000 minutes attained in the case of power application of 2.5W corresponds to life of at least about 120,000 to at least 312,000 minutes attained in the case of 1W.

Thus, the life of the aluminum epitaxial film containing Cu was about 130 to about 340 times longer than that of the pure aluminum epitaxial film. It has been recognized that Cu may be replaced by Ti, Ni, Mg, Pd or the like, for attaining long life of the aluminum film. In general, the content of such an admixture must be at least 0.1 percent by weight in order to attain a practical effect, while this content is preferably not more than 10 percent by weight, so that resistivity of the aluminum film is not increased.

An extremely thin film of Ti, Cr or the like may be previously formed on the piezoelectric substrate as an underlayer for the aluminum oriented film in a thickness not preventing orientation of the aluminum film.

While the aluminum epitaxial film attained (311) orientation on the substrate of Y-cut quartz crystal rotating at an angle of 25° to 39°, the same may be oriented on a substrate of crystal rotating at another angle.

In general, crystal lattices of a substrate and an aluminum film must almost conform with each other to attain epitaxial growth of the aluminum film. Since crystal lattices almost conform with each other between a substrate of Y-cut crystal rotating at an angle of about 30° and the (311) plane of an aluminum film, an aluminum film is epitaxially grown on a substrate of Y-cut quartz crystal rotating at an angle of 25° to 35° in (311) plane orientation. However, the (311) plane of the aluminum epitaxial film may not necessarily be parallel to the surface of the crystal substrate. If the cut plane of the quartz crystal substrate is out of the aforementioned range of angles, the aluminum epitaxial film is so oriented that its (311) plane is inclined along the cut plane of the quartz crystal substrate. Thus, the aluminum film is oriented in correspondence to the angle of rotation of the cut crystal forming the substrate, and hence the material for the crystal substrate is not particularly restricted to rotating Y-cut quartz crystal. For example, it is possible to epitaxially grow an aluminum film on a substrate of doubly rotated cut quartz crystal so that the (311) plane of the aluminum film substantially satisfies the condition of conformity between the crystal lattices.

In relation to this, a specularly polished substrate of Y-cut (LST-cut) crystal rotating at an angle of 105° was employed as a piezoelectric substrate, which was treated similarly to the above Example to obtain a surface acoustic wave device 1 shown in FIG. 1. Such a substrate of Y-cut quartz crystal rotating at 105° has good temperature characteristics as hereinabove described, while the quality factor of a resonator is reduced if the thickness of aluminum electrodes formed thereon exceeds 1 of the wavelength of surface acoustic waves.

Figure 7A:
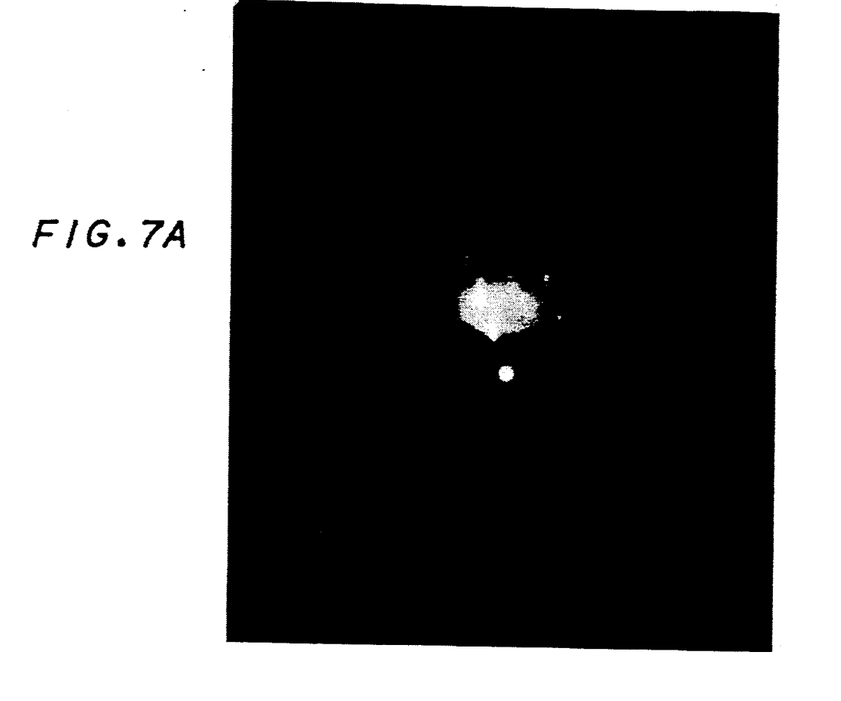
FIG. 7A is a photograph of an aluminum film according to another Example of the present invention taken through RHEED.

The aforementioned crystal substrate was applied to the piezoelectric substrate 2 shown in FIG. 1, and an aluminum film of about 400Å in thickness (about 0.7% of the wavelength) was formed on the piezoelectric substrate 2 under conditions for electron beam deposition similar to those in the above Example. Epitaxial growth of this aluminum film was confirmed through RHEED. FIG. 7A shows a photograph of the aluminum film taken through RHEED, and FIG. 7B is an explanatory diagram for FIG. 7A.

Figure 7B:
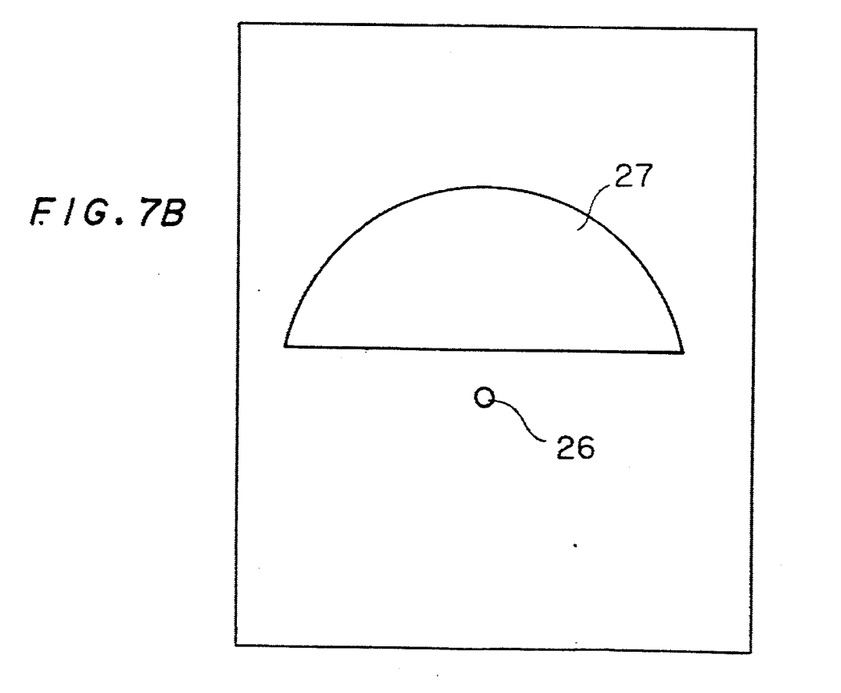
FIG. 7B is an explanatory diagram for FIG. 7A.

Referring to FIG. 7B, numeral 26 denotes a direct spot of an electron beam, and a reflected pattern appears in a region 27. Spots indicating epitaxial growth of the aluminum film can be confirmed in this reflected pattern.

The aluminum film was then worked through photolithography, to prepare a two-port SAW resonator 1 shown in FIG. 1. This resonator 1 was similar to that of the above Example, except for that the wavelength of surface acoustic waves was about 5.9 μm, the width of each electrode finger was 1.47 μm and each of grating electrodes forming reflectors 5 and 6 was provided with 500 metal strips.

The SAW resonator 1 exhibited characteristics which were substantially similar to those shown in FIG. 2.

The life of this resonator was evaluated through the system shown in FIG. 3, similarly to the above Example.

The life of a sample having transducers 3 and 4 and reflectors 5 and 6 formed from an epitaxial film of pure aluminum was at least 800 minutes in power application of 1W. The life of another sample having transducers 3 and 4 and reflectors 5 and 6 formed from an epitaxial aluminum film containing 1 percent by weight of Cu was too long for power application of 1W. This sample attained life of at least 7000 minutes in power application of 2.5W. This life corresponds to that of at least about 105,000 to about 273,000 minutes attained in the case of power application of 1W, in accordance with the aforementioned acceleration factor.

Similarly to the above Example, the amount of Cu to be added to the aluminum epitaxial film is preferably 0.1 to 10 percent by weight. Further, Cu may be placed by Ti, Ni, Mg, Pd or the like.

An LST-cut crystal substrate of the same type as above was employed as a piezoelectric substrate, and a random-oriented aluminum film of 400Å in thickness was formed on the substrate to similarly prepare a two-port SAW resonator as reference example. This resonator had large insertion loss, and exhibited no characteristics which must be originally provided in a two-port SAW resonator.

Figure 8:
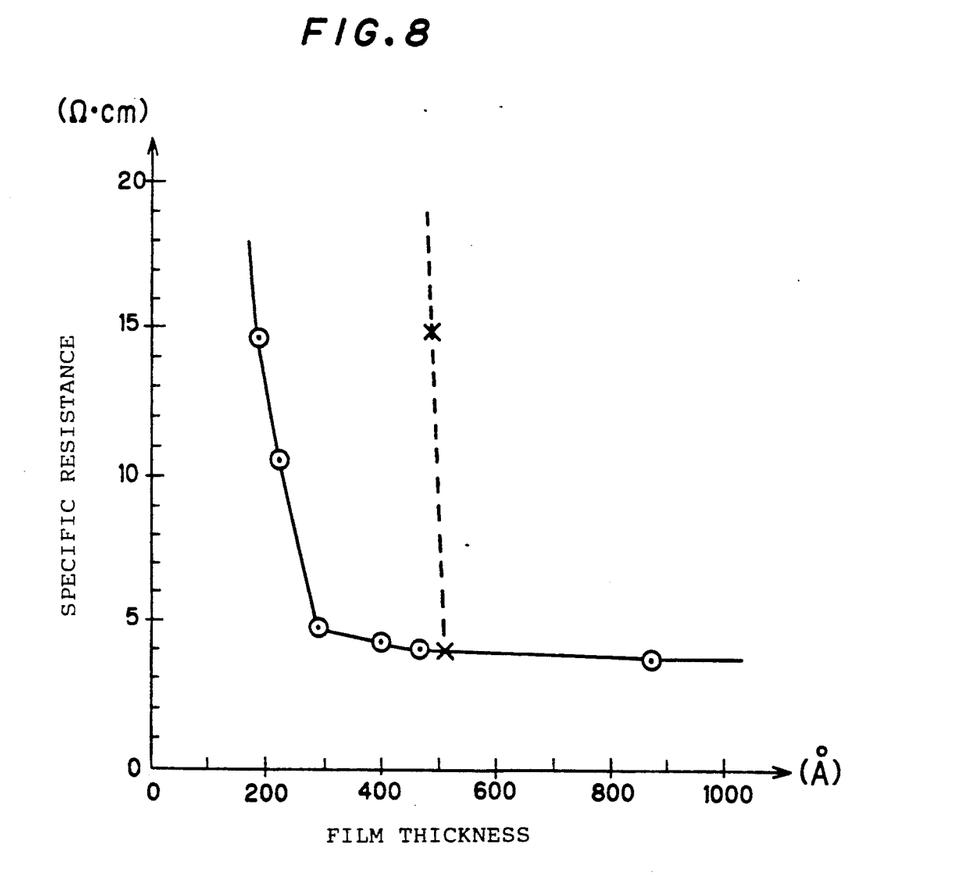
FIG. 8 is a graph showing relation between the thickness of aluminum electrodes in Example shown in FIG. 7A and specific resistance thereof.

FIG. 8 shows relation between film thickness and electrical resistivity of each of an aluminum epitaxial film and an aluminum random-oriented film. Referring to FIG. 8, the horizontal line represents the film thickness (Å), and the vertical line represents specific resistance ($\Omega \cdot cm$). The solid line shows the aluminum epitaxial film, and the broken line shows the aluminum random-oriented film.

As shown in FIG. 8, the aluminum epitaxial film (solid line) is retained in low resistivity at the film thickness of 400Å, while the aluminum random-oriented film (broken line) already exhibits extremely high resistivity at the film thickness of 400Å. This may be because the aluminum random-oriented film, which is formed by an aggregate of grains, shows an island structure and cannot attain good electrical conduction when the same is reduced in thickness.

Although the piezoelectric substrate is formed of crystal in the above description, the same may alternatively be prepared from $LiNbO_3$, $Li_2B_4O_7$, $ZnO/Al_2O_3$ or the like. In the latter case, it is possible to form an aluminum oriented film by appropriately selecting film forming conditions and/or a film forming method such as ion beam sputtering, ion plating or the like. In this case, the aluminum epitaxial film may not be restricted to a (311) oriented film, but crystal orientation of the aluminum epitaxial film is decided to satisfy the condition as to conformity of crystal lattices between the aluminum film and the substrate in any case.

Particularly when the piezoelectric substrate is prepared from $LiTaO_3$, $LiNbO_3$ or $Li_2B_4O_7$ having a large electromechanical coupling coefficient, it is possible to implement a SAW filter having a wider band and lower insertion loss, or a resonator having a small capacitance ratio as compared with the case of employing a quartz crystal substrate. A SAW device having zero temperature coefficient can be implemented particularly when a substrate of X-cut Li$_2$B$_4$O$_7$ rotating at an angle of 45° is employed.

Although the present invention has been described and illustrated in detail, it is clearly understood that the same is by way of illustration and example only and is not to be taken by way of limitation, the scope of the present invention being limited only by the terms of the appended claims.

What is claimed is:

1. A surface acoustic wave device comprising:
a piezoelectric substrate; and
electrode means formed on said piezoelectric substrate, said electrode means including an aluminum film epitaxially grown on said substrate and crystallographically oriented in a constant direction.

2. A surface acoustic wave device in accordance with claim 1, wherein said piezoelectric substrate is made of rotating Y-cut quartz crystal.

3. A surface acoustic wave device in accordance with claim 2, wherein the angle of rotation of said rotating Y-cut quartz crystal is 25° to 39°.

4. A surface acoustic wave device in accordance with claim 1, wherein said piezoelectric substrate is made of LiTaO$_3$.

5. A surface acoustic wave device in accordance with claim 1, wherein said piezoelectric substrate is made of LiNbO$_3$.

6. A surface acoustic wave device in accordance with claim 1, wherein said piezoelectric substrate is made of Li$_2$B$_4$O$_7$.

7. A surface acoustic wave device in accordance with claim 1, wherein said aluminum film contains an admixture prepared from at least one element selected from a group of Cu, Ti, Ni, Mg and Pd.

8. A surface acoustic wave device in accordance with claim 7, wherein said aluminum film contains 0.1 to 10 percent by weight of said admixture.

9. A surface acoustic wave device comprising:
a piezoelectric substrate; and
electrode means formed on said piezoelectric substrate, said electrode means including an aluminum film being crystallographically oriented in a constant direction;
wherein said aluminum film is a (311) oriented film.

10. A surface acoustic wave device comprising:
a piezoelectric substrate; and
electrode means formed on said piezoelectric substrate, said electrode means including an aluminum film being crystallographically oriented in a constant direction;
wherein said piezoelectric substrate is made of Li$_2$B$_4$O$_7$ and
is an X-cut substrate having an angle of rotation of 45°.

11. A surface acoustic wave device comprising:
a piezoelectric substrate; and
electrode means formed on said piezoelectric substrate, said electrode means including an aluminum film being crystallographically oriented in a constant direction;
wherein said piezoelectric substrate comprises a sapphire substrate and a ZnO thin film epitaxially grown on said sapphire substrate.

12. A surface acoustic wave device comprising:
a piezoelectric substrate; and
electrode means formed on said piezoelectric substrate, said electrode means including an aluminum film being crystallographically oriented in a constant direction;
wherein said piezoelectric substrate is made of rotating Y-cut quartz crystal; and
wherein the angle of rotation of said rotating Y-cut quartz crystal is 103° to 107°.

13. A surface acoustic wave resonator comprising:
a piezoelectric substrate; and
at least one transducer and at least two reflectors positioned to enclose said transducer, formed on said piezoelectric substrate, said transducer including an aluminum film epitaxially grown on said substrate and crystallographically oriented in a constant direction.

14. A surface acoustic wave resonator in accordance with claim 13, wherein said reflectors include aluminum films epitaxially grown on said substrate and crystallographically oriented in a constant direction.

15. A surface acoustic wave filter comprising:
a piezoelectric substrate; and
input and output transducers formed on said piezoelectric substrate, said input and output transducers including aluminum films epitaxially grown on said substrate and crystallographically oriented in a constant direction.

* * * * *